(12) United States Patent
Martinez

(10) Patent No.: US 6,627,901 B2
(45) Date of Patent: Sep. 30, 2003

(54) APPARATUS AND METHOD FOR DISTRIBUTION OF DOPANT GASES OR VAPORS IN AN ARC CHAMBER FOR USE IN AN IONIZATION SOURCE

(75) Inventor: Christopher D. Martinez, Roseville, CA (US)

(73) Assignee: NEC Electronics, Inc., Santa Clara, CA (US)

(*) Notice: Subject to any disclaimer, the term of this patent is extended or adjusted under 35 U.S.C. 154(b) by 167 days.

(21) Appl. No.: 09/754,442

(22) Filed: Jan. 4, 2001

(65) Prior Publication Data
US 2002/0084258 A1 Jul. 4, 2002

(51) Int. Cl.$^7$ ................................. H01J 27/00
(52) U.S. Cl. ..................... 250/427; 250/423 R
(58) Field of Search .................. 250/423 R, 427

(56) References Cited

U.S. PATENT DOCUMENTS

| | | | |
|---|---|---|---|
| 4,658,143 A | 4/1987 | Tokiguchi et al. | 250/423 R |
| 5,497,006 A | 3/1996 | Sferlazzo et al. | 250/427 |
| 5,523,646 A | 6/1996 | Tucciarone | 313/359.1 |
| 5,861,596 A | 1/1999 | Grass et al. | 218/34 |
| 5,892,232 A | 4/1999 | Tsai et al. | 250/426 |
| 6,439,155 B1 * | 8/2002 | Kamarchi et al. | 118/723 ME |

FOREIGN PATENT DOCUMENTS

JP    405174778 A  *  7/1993

OTHER PUBLICATIONS

Harper, James M. E., "Ion Beam Deposition," *Thin Film Processes,* Chapter II–5, 1978 by Academic Press, Inc., pp. 175–189.

Wolf, Stanley and Richard N. Tauber, Silicon Processing for the VLSI Era, vol. 1: Process Technology, 1986 by Lattice Press, pp. 309–317.

* cited by examiner

*Primary Examiner*—Bruce Anderson
(74) *Attorney, Agent, or Firm*—Skjerven Morrill LLP

(57) ABSTRACT

An apparatus and method for distributing dopant gas or vapor in an arc chamber of ion source used as part of an ion implanter. The apparatus includes a plenum, a sub-plenum, and a baffle to distribute the dopant gas or vapor through out the arc chamber. The method allows dopant gas and vapors to be distributed in such a way as to cause efficient reaction of dopant gas or vapor molecules with electrons created by a filament contained in the arc chamber. The reaction of dopant gas or vapor molecules with the electrons in turn produces positively charged ions by the ion implanter.

12 Claims, 4 Drawing Sheets

APPARATUS AND METHOD FOR DISTRIBUTION OF DOPANT GASES OR VAPORS IN AN ARC CHAMBER FOR USE IN AN IONIZATION SOURCE

BACKGROUND OF THE INVENTION

1. Field of the Invention

This invention relates to a method and an apparatus using a baffled arc chamber, and more particularly use of a baffled arc chamber in an ionization source as part of an ion implanter for depositing ions on wafers.

2. Description of the Related Art

In the manufacturing of silicon wafers, ion implantation is an effective and accurate method to dope required regions through a selective addition of properly charged ions. In an ion implanter dopant atoms are ionized and isolated, accelerated, formed into an ion beam, and swept across a wafer. These dopant atoms bombard the silicon wafer, enter the surface and eventually come to rest below the surface of the wafer.

An ion implanter involves many sophisticated sub-systems, each sub-system performing a specific action on the ions. In ion implanters, gas and solid sources are used. The gas sources typically are contained in gas cylinders and are connected to the ion source sub-system through mass flow meters controlling the gas. When solids are used, the solids are in powder form and vaporized into the ion source sub-system.

The ion source sub-system consists of a gas inlet or inlets, control meters, and typically a separate inlet for vapors, whenever solid powders are used. The inlet or inlets lead into an ionization source chamber, sometimes also referred to as an arc chamber. An electrically activated filament typically is used in the chamber. When the filament is activated, electrons are formed. As gas or vapor is introduced into the chamber, the electrons collide with the dopant source molecules of the gas or vapor and positively charged ions are created. Gas molecules are transformed into positively charge ions that may or may not be used in the ion beam. In addition to the desired ions, unneeded atoms or ions are created. As example, when the gas $BF_3$ is used in an ionization chamber, the following species (ions and atoms) are created in the chamber: $B^+$, $BF^+$, $BF_2^+$, $BF_3$, $F^+$, $F_2^+$, $B_{11}^+$, $B_{11}F^+$, $B_{11}F_2^+$, and $BF_3^+$. In typical applications, only the $B^+$ ion is desired. The other species created in the chamber are not wanted on the wafer.

Ion separation or selection is conducted by a mass analyzer. The mass analyzer creates a magnetic field in which the species enter. The species leave the chamber with voltages of 15 to 40 keV (thousand electron volts) which translates to a relatively high speed of travel through the magnetic field. In the magnetic field, each species is bent into an arc and travels along a specific radius. The specific radius of travel is determined by the individual species, the speed of the species, and the strength of the magnet field. At the end of the mass analyzer is an exit slit in which only one species can exit. It is expected that some contamination will exist when secondary collisions are made between species. It has been found that if the gas or vapors are efficiently disassociated into the species, the less likely will be these secondary collisions. The strength of the magnet therefore is adjusted to properly align the path of the ion with the exit slit.

Upon leaving the analyzer, the ions move into an acceleration tube. The acceleration tube brings the ions to a high enough velocity to gain the necessary momentum to implant the ions into the wafer. The acceleration tube has anodes along its sides; the negative charge of the anodes gradually increases as the positively charged ions accelerate along the tube. Adjusting the charge on the anodes determines the acceleration and the momentum of the ions, and ultimately how deep the dopant ions will be implanted into the wafer.

The stream of ions exiting the tube is often referred to as an ion beam, however, it is actually an electric current. The current level determines the number of ions implanted over a time interval. The higher the current, the more ions that are implanted per minute. Ion implanters are commonly categorized as to the beam current that they produce. Medium current implanters produce currents of about 0.5 to 1.7 milliamperes (mA), while high current implanters produce currents of about 10 mA. Regardless of the classification of the implanter, it is a key requirement that the implanter have a consistent beam current to effectively dope the wafer.

The ionization or arc chamber described above is usually used by medium current implanters. In a "Freeman Ion Source" the filament in the chamber extends across the chamber, electrons radiating from the filament. An alternate or more common application involves a coiled over filament that is attached at one end of the chamber opposite a repellar plate. Electrons are generated by the filament and repelled by the repellar plate. This setup is known as a "Bernas Ion Source." Since it is highly desired to have more electrons react (collide) with more dopant atoms, the electron distribution of the "Bernas" setup has found to be more effectively. To further create greater reaction rates, some gas chambers have incorporated multiple gas inlets leading into the chamber. Additional gas inlets have required the need for additional flow meters and additional control requirements. Over time, due to waste by-products these gas inlet lines become constricted and must be cleaned out. The more inlet lines to the arc chamber, the more lines that must be cleaned out and maintained. Many ion sources also incorporate a separate inlet for vapors. From a maintenance perspective, inefficient reaction of dopant gas or vapors in the arc chamber requires more frequent cleaning.

Because of the need to maintain a consistent beam current, control systems are set in place to adjust filament voltage and gas inflow to assure that the proper amount of the required ions are generated. At times it may take up to 15 minutes to automatically "tune" a filament for the proper voltage in consideration of the rate of reactions that are taken place. If the reaction rates between electrons and gas or vapors can be made more efficient this "tuning" time can be reduced.

Creating more electrons may translate to more collisions forming more charged usable ions, however, there must be a greater number of such ions to collide with. This requires greater gas (or vapor) flow. Gas (vapor) flow, however, is limited by the gas (vapor) inlet (s), the size the chamber, and other operating considerations such as pressure within the chamber. Increasing gas (vapor) flow also may mean that there will be more gas or vapor that is not used in the process and is wasted. An improved gas chamber, which better distributes gases and vapors, is clearly desirable for ion sources used in ion implanters.

SUMMARY OF THE INVENTION

Accordingly, one object of the present invention is to provide an ionization or arc chamber that distributes the dopant source gas or vapor entering the arc chamber, so that there is a greater opportunity for atoms of the gas or vapor molecules to react (collide) with electrons generated by a filament in the chamber.

Another object is to provide a single entry into the arc chamber for gases and vapors, eliminating multiple source inlets.

Briefly described, the invention contemplates a gas or arc chamber that includes a plenum that is mounted at the base of the arc chamber. Gas enters the plenum through a single inlet and redistributed in the plenum. Vapors from solid powders enter through separate inlets, however, the vapors are also collected in the plenum. The plenum is connected to a baffle. The baffle is inserted into the base of the arc chamber. Gas or vapor enters the plenum and is directed into a sub-plenum of the baffle. The baffle distributes the gas or vapor throughout the arc chamber, maintaining a uniform volume distribution inflow to the arc chamber. The greater distribution of the gas or vapor in turn allows a greater chance of interaction or collision between dopant atoms of the gas or vapors and electrons formed by the filament resulting in a more uniform ion plasma.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION OF THE PREFERRED EMBODIMENTS

Figure 1:
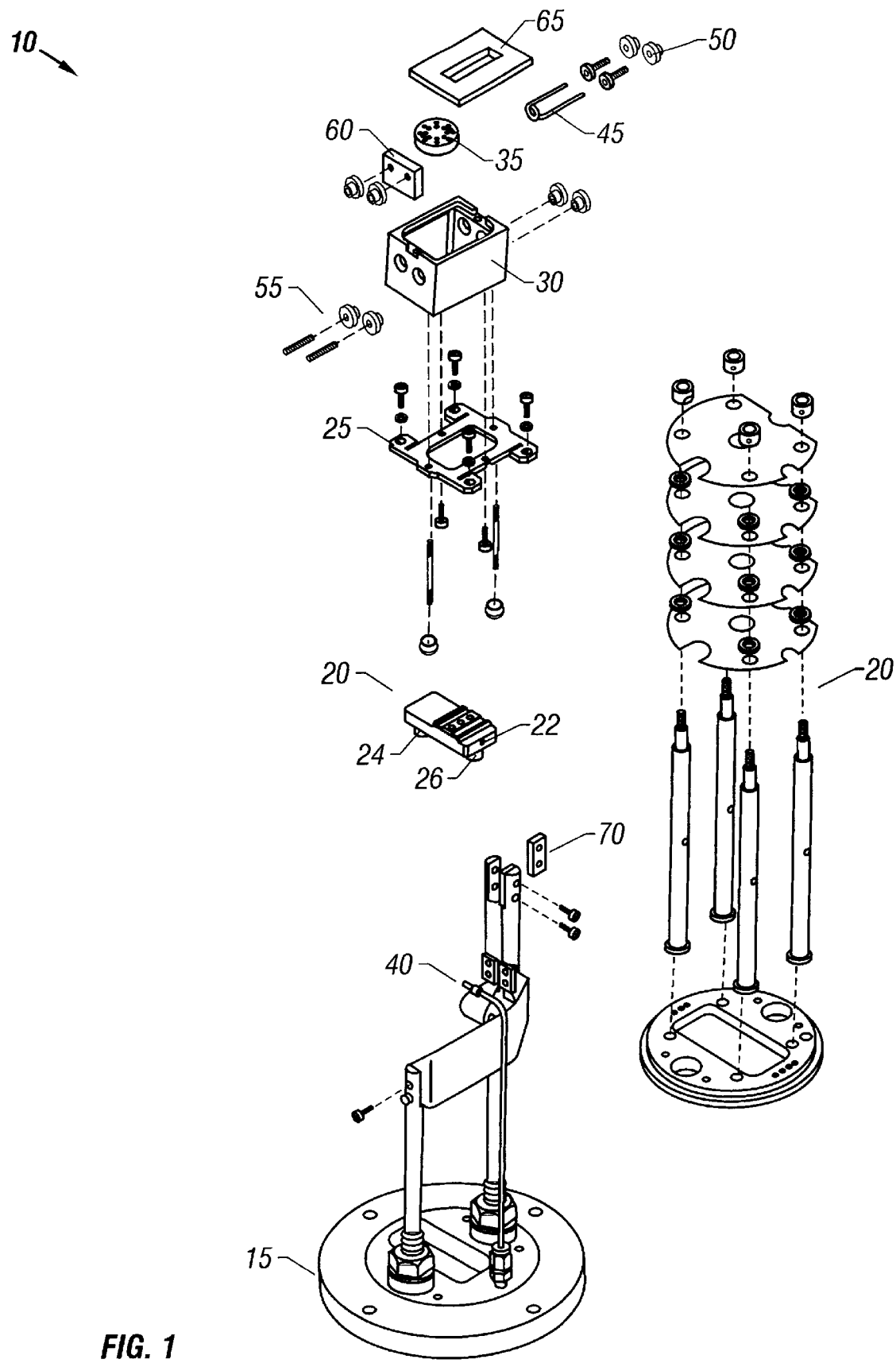
FIG. 1 is an expanded diagram of a medium current ion source with the plenum and baffle.

In the description which follows, the drawing figures are not necessarily to scale, and certain features of the invention may be shown exaggerated in scale in the interest of clarity and conciseness.

FIG. 1 depicts an expanded view of an ion source 10. The ion source 10 is the sub-system providing charged ions in an ion implanter. In this embodiment the ion source 10 supplies ions for a medium current ion implanter. Charged ions created in the ion source 10 are selected by a mass analyzer, and the chosen dopant ions or species are formed as an ion beam. The particular medium current ion source 10 that is illustrated is typically known as a Bernas ion source. A Bernas ion source implements a coiled over filament 45. When filament 45 is activated or heated, filament 45 creates electrons. The electrons provided by filament 45 are used in the ionization process. Ion source 10 further has a base 15. On the base 15 is a support structure 17. A support plate 25 is mounted on the support structure 17. Plenum 20 is mounted underneath the support 25 and connected to the arc chamber 30. An exit slit 65 for charged ions is placed and connected flush against the top of arc chamber 30. The exit slit in turns leads to a mass analyzer. Gas baffle 35 is inserted into the floor of the arc chamber 30. Baffle 35 is connected flush to plenum 20. An electron repeller plate 60 is connected inside of arc chamber 30. Repeller plate 60 repels electrons created by filament 45. Mounting hardware 55 connects the repeller plate 60 to the arc chamber 30. Likewise, mounting hardware 50 connects filament 45 to the arc chamber 30.

Plenum 20, in this particular embodiment, has three source inlets. The three source inlets include vapor inlet 24 for a particular type of solid powder that is vaporized, and vapor inlet 26 for a dissimilar type of solid powder. In this embodiment a separate gas inlet 22 leads into the plenum 20. Gas inlet 22 is connected to a gas line 40 of the ion source 10. Depending on the embodiment, a single inlet or multiple inlets may lead into the plenum 20. A support structure 70 connects to the filament support structure 50. In addition, support structure 70 may provide support for electrical connections leading to filament 45.

Figure 2:
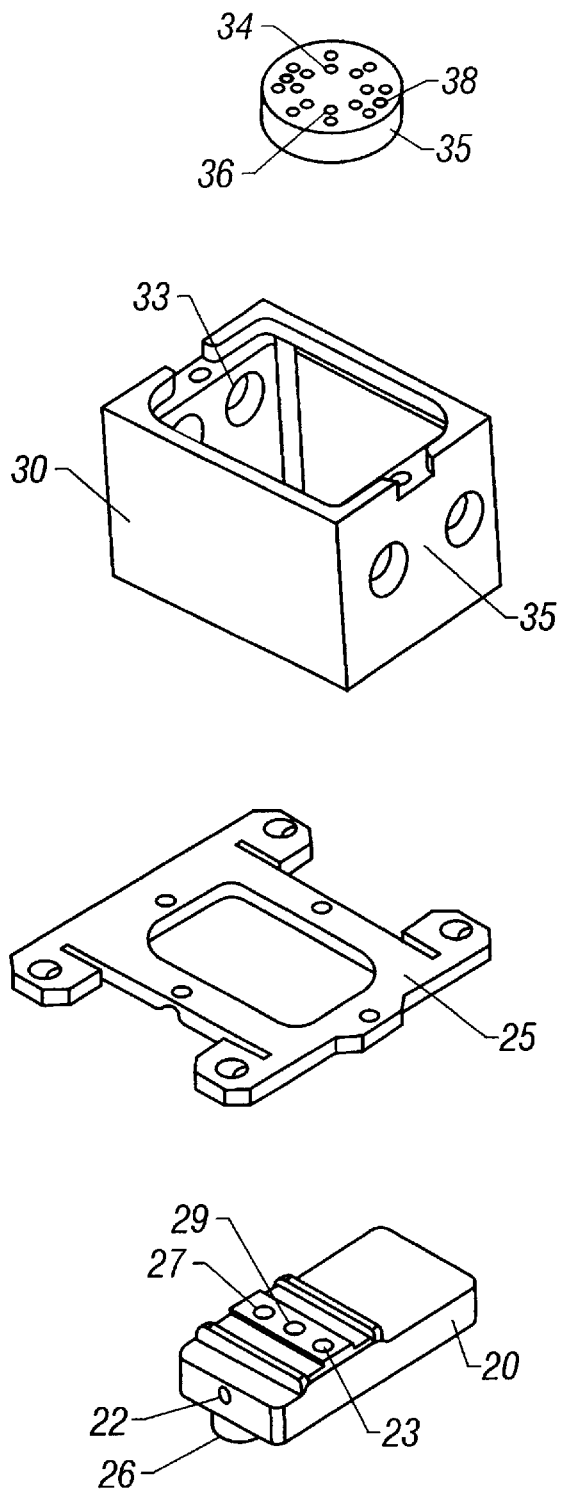
FIG. 2 is an expanded diagram of the arc chamber, arc chamber support, plenum, and baffle.

Now referring to FIG. 2, shown is an expanded view of the arc chamber 30, the baffle 35, the support plate 25 and the plenum 20. The baffle 35 has a plurality of exit holes 38 and has support hole 34 and support hole 36 extending through the baffle 35. Baffle 35 is placed inside of arc chamber 30 and laid flush against the bottom of arc chamber 30. Support holes 33 and support holes 31 are provided to mount repeller plate 60 and filament 45. Support plate 25 is mounted underneath arc chamber 30. Support plate 25 is flush with arc chamber 30. The plenum 20 is inserted flush against the support plate 25 and mounting holes 27 and 23 connect with holes 34 and 36 of the baffle 35. An inlet hole 29 is connected directly to plenum 20. Dopant gases and vapors exit the plenum out of exit hole 29 and collected in baffle 35. In this particular embodiment, a gas inlet hole 22 is located on plenum 20. A vapor inlet hole 26 is also provided on plenum 20. When gases are used, the gases shall enter gas inlet hole 22, while vapor inlet hole 26 and any other inlet holes are blocked. Different vapor inlet holes may be provided, depending on the type of solid powder that is vaporized into the arc chamber 30.

Figure 3:
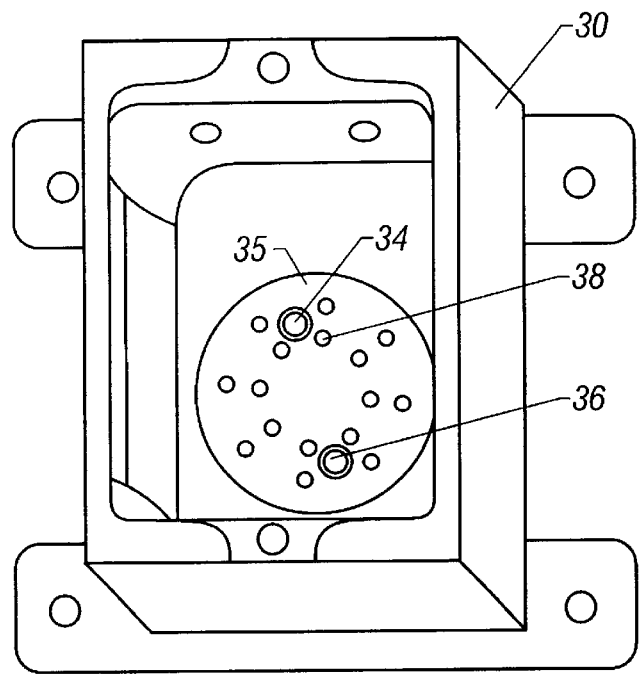
FIG. 3 is a top view of the arc chamber with the baffle.

Now referring to FIG. 3, a top view of arc chamber 30 is shown. As the figure illustrates, baffle insert 35 is flush against the bottom of the arc chamber 30. The plurality of exit holes 38 effectively distributes the gas or vapors throughout the arc chamber 30. Support hole 34 and support hole 36 extend through the baffle 35 and allow screws or bolts to be placed through and connected to the plenum 20. Support plate 25 is an intermediate connection between arc chamber 30 and plenum 20.

Figure 4:
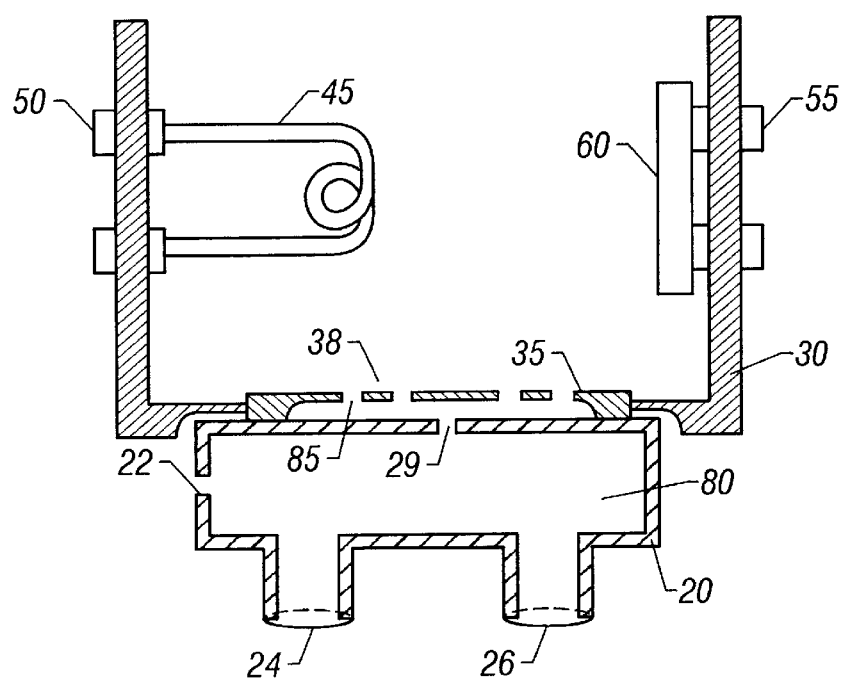
FIG. 4 illustrates the cross section of the art chamber, the baffle, and the plenum, and further illustrates the filament and electron repeller.

FIG. 4 depicts a cross sectional view of the arc chamber 30, baffle 35 and plenum 20. Filament 45 is mounted to the arc chamber 30 with mounting hardware 50. Repeller plate 60 is similarly mounted on arc chamber 30 with mounting hardware 55. As the filament 45 is heated or activated, electrons are created and formed in the arc chamber 30. The electrons created by filament 45 are repelled by repeller plate 60 in the arc chamber 30. When the dopant gas or vapor is introduced into the arc chamber 30, charged ions are formed by the collision of the dopant gas or vapor molecules with the electrons. The gas is introduced into the arc chamber via baffle 35 which in turn is connected to plenum 20. Plenum 20 has multiple inlets, in this case gas inlet 22, a vapor inlet 24 that is used for a particular solid powder and another vapor inlet 26 used for a different type of vapor powder. The dopant gas or vapor is collected in the interior 80 of the plenum 20. The dopant gas or vapor then exits out of interior 80 of the plenum 20 through exit hole 29. Baffle 35 has a recession and when the baffle 35 is placed flushed against the plenum 20, a sub-plenum 85 is created. Sub-plenum 85 collects and redistributes the dopant gas or vapor exiting from exit hole 29. Sub-plenum 85 redistributes the dopant gas or vapor across the plurality of exit holes 38. Without sub-plenum 85, dopant gas or vapor exiting exit hole 29 will enter the arc chamber 30 through the nearest available exit holes of the plurality of exit holes 38. In other words, if exit hole 29 leads directly to the plurality of exit holes 38, the dopant gas or vapor will have a tendency to exit from the exit holes in the center of baffle 35. The combination of the plenum 20, exit hole 29, sub-plenum 85, and plurality of exit holes 38 allows for the dopant gas and vapors to be evenly distributed throughout the arc chamber 30. A greater distribution of dopant gas or vapor means a greater reaction rate with electrons created by filament 45. A greater reaction rate between dopant gas or vapor and electrons will produce a greater number of charged ions, in specific the required species of ions that are used for the ion beam. Greater reaction efficiency translates to shorter tuning adjustments for the filament 45 and gas inflow. In addition, greater reaction efficiency produces less waste by-products.

Figure 5:
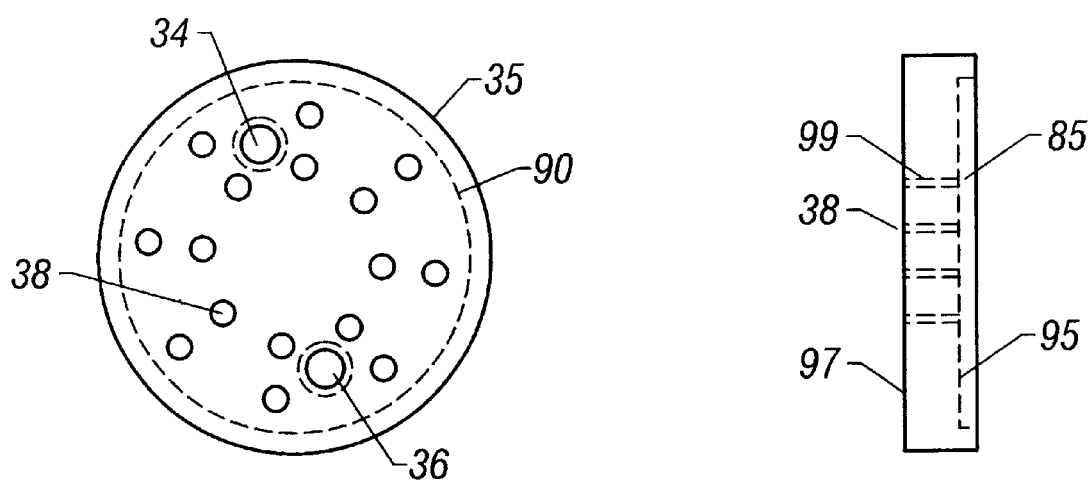
FIG. 5 illustrates the top and cross section of the baffle.

FIG. 5 depicts a top view of baffle 35 and a cross sectional view of the baffle 35. In an embodiment there are sixteen holes in the plurality of exit holes 38. Eight holes are evenly spaced one from the other, 0.225 inches from the center of the baffle 35. The other eight exit holes are placed 0.325 inches from the center of the baffle 35. It is contemplated that there can be numerous variations regarding the number of exit holes and placement of the exit holes on the baffle. Support hole 34 and support hole 36 extend through the baffle 35. In this particular embodiment, support hole 34 and support hole 36 are placed directly opposite one another and are 0.315 inches from the center of baffle 35. Mounting hole 34 and mounting hole 36 in this embodiment are 0.100 inches in diameter. Variations in the number of mounting holes, their location, and their size are also contemplated.

The cross sectional view of the baffle 35 illustrates the sub-plenum 85. The sub-plenum 85 has a diameter 90 of 0.900 inches in this embodiment. In this embodiment, the baffle has an overall thickness of 0.175 inches. The recession 95 of the sub-plenum 85 is 0.035 inches from the surface of the baffle 35. The plurality of exit holes 38 extend to the sub-plenum 85. In this embodiment the thickness 97 of one the exit holes is 0.062 inches in diameter. The diameter or diameters of the exit holes can vary from one embodiment to another.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the present invention are presented for purposes of illustration and description; they are not intended to be exhaustive or to limit the invention to the precise forms disclosed, obviously many modifications and variations are possible in view of the above teachings. Features described in a particular embodiment can be used by a separately described embodiment. For example various inlets to the plenum may be used. Instead of a single exit hole from the plenum to the baffle, multiple exit holes may be utilized. The number of exit holes from the baffle may vary as well as their placement and size. Elements such as the plenum, baffle and arc chamber may be combined into an integrated piece or pieces. Elements may be made as separate pieces, such as separate sub-pleneum assembly. These embodiments were chosen and described in order to best explain the principles of the invention and its practical applications and to thereby enable others skilled in the art to best utilize the invention and various embodiments with various modifications as are suited to the particular use contemplated. It is intended that the scope of the invention be defined by the following claims and their equivalents:

What is claimed is:

1. An apparatus for use in an ion implant machine, the apparatus comprising:
   an arc chamber;
   a plenum;
   a first plenum wall;
   a sub-plenum, and;
   a baffle comprising a plurality of apertures through which fluid may flow between the sub-plenum and the arc chamber;
   wherein fluid may flow between the plenum and the sub-plenum through an aperture formed in the first plenum wall positioned between the plenum and the sub-plenum.

2. The apparatus of claim 1 wherein the sub-plenum is defined by the baffle and the first plenum wall.

3. The apparatus of claim 1 further comprising a second plenum wall, wherein fluid may flow into the plenum through an aperture formed in the second plenum wall.

4. The apparatus of claim 1 wherein fluid may flow into the sub-plenum only through the aperture formed in the first plenum wall.

5. The apparatus of claim 1 wherein each of the apertures of the baffle is out of alignment with the aperture formed in the first plenum wall.

6. The apparatus of claim 1 wherein each of the apertures of the baffle has a diameter ranging from 0.010 to 0.100 inches.

7. The apparatus of claim 1 it further comprising:
   first and second arc chamber walls;
   a filament mounted to the first arc chamber wall;
   a repeller plate mounted to the second arc chamber wall;
   wherein the baffle is positioned such that fluid passing through baffle apertures into the arc chamber, passes between the filament and repeller plate.

8. A method of distributing gas or vapor in an arc chamber used in an ion implanter, the method comprising:
   (a) the arch chamber receiving gas or vapor from a sub-plenum via a plurality of apertures formed in a baffle;
   (b) the sub-plenum receiving gas or vapor from a plenum via an aperture formed in an aperture of a first plenum wall, wherein the baffle and first plenum wall define the sub-plenum;
   (c) the plenum receiving gas or vapor from an aperture formed in a second plenum wall.

9. The method of claim 8 wherein gas or vapor may flow into the sub-plenum only through the aperture formed in the first plenum wall.

10. The method of claim 8 wherein each of the apertures of the baffle is out of alignment with the aperture formed in the first plenum wall.

11. The method of claim 8 wherein each of the apertures of the baffle has a diameter ranging from 0.010 to 0.100 inches.

12. The method of claim 8 further comprising gas or vapor passing through the baffle apertures, flows between a filament and repeller plate mounted to first and second arc chamber walls, respectively.

* * * * *